US011488652B2

(12) United States Patent
Mori

(10) Patent No.: US 11,488,652 B2
(45) Date of Patent: Nov. 1, 2022

(54) SEMICONDUCTOR MEMORY DEVICE TO CONTROL OPERATING TIMING BASED ON TEMPERATURE OF THE MEMORY DEVICE

(71) Applicant: Winbond Electronics Corp., Taichung (TW)

(72) Inventor: Kaoru Mori, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/362,629

(22) Filed: Jun. 29, 2021

(65) Prior Publication Data
US 2022/0199149 A1   Jun. 23, 2022

(30) Foreign Application Priority Data
Dec. 18, 2020 (JP) .............................. JP2020-210323

(51) Int. Cl.
| G11C 11/406 | (2006.01) |
| G11C 11/4076 | (2006.01) |
| H03K 19/17728 | (2020.01) |
| G11C 11/4074 | (2006.01) |

(52) U.S. Cl.
CPC .... *G11C 11/40626* (2013.01); *G11C 11/4074* (2013.01); *G11C 11/4076* (2013.01); *G11C 11/40615* (2013.01); *H03K 19/17728* (2013.01)

(58) Field of Classification Search
CPC ........ H03K 19/17728; G11C 11/40626; G11C 11/40615; G11C 11/4074; G11C 11/4076
See application file for complete search history.

(56) References Cited

U.S. PATENT DOCUMENTS

| 2018/0144781 A1 | 5/2018 | Lim |
| 2022/0091786 A1* | 3/2022 | Okamoto ............ G06F 12/0891 |

FOREIGN PATENT DOCUMENTS

| CN | 103021451 A | | 4/2013 |
| JP | 2007-133526 A | | 5/2007 |
| KR | 20060014210 A | * | 2/2006 |
| TW | 201608354 A | | 3/2016 |

OTHER PUBLICATIONS

Japanese Office Action for Japanese Application No. 2020-210323, dated Nov. 30, 2021, with an English translation.

* cited by examiner

*Primary Examiner* — Sultana Begum
(74) *Attorney, Agent, or Firm* — Birch, Stewart, Kolasch & Birch, LLP

(57) ABSTRACT

A semiconductor memory device can appropriately control operation timing, based on changes in the environment (for example, power supply voltage and temperature, etc.) when in use. The semiconductor memory device includes a temperature sensor 18 that detects the temperature of the semiconductor memory device, a voltage detection portion (composed of a ring oscillator 14 and a counter 15) that detects the power supply voltage of the semiconductor memory device, and a control portion 10 that controls the operation timing in the semiconductor memory device to meet specific conditions, according to the temperature detected by the temperature sensor 18 after the power is applied and the voltage detected by the voltage detection portion after the power is applied.

6 Claims, 9 Drawing Sheets

FIG. 3 (a)

| PTIM<4:0> | delay amount | PTIM<4:0> | delay amount |
|---|---|---|---|
| 0 | 0 | 16 | -x ps |
| 1 | +x ps | 17 | -2x ps |
| 2 | +2x ps | 18 | -3x ps |
| 3 | +3x ps | 19 | -4x ps |
| 4 | +4x ps | 20 | -5x ps |
| 5 | +5x ps | 21 | -6x ps |
| 6 | +6x ps | 22 | -7x ps |
| 7 | +7x ps | 23 | -8x ps |
| 8 | +8x ps | 24 | -9x ps |
| 9 | +9x ps | 25 | -10x ps |
| 10 | +10x ps | 26 | -11x ps |
| 11 | +11x ps | 27 | -12x ps |
| 12 | +12x ps | 28 | -13x ps |
| 13 | +13x ps | 29 | -14x ps |
| 14 | +14x ps | 30 | -15x ps |
| 15 | +15x ps | 31 | -16x ps |

FIG. 3 (b)

| TMP<1:0> | CNT<4:0> >= n | | |
|---|---|---|---|
| | 00 (y1 °C ~ y2 °C) | 01 (y2 °C ~ y3 °C) | 11 (y3 °C ~ y4 °C) |
| high-speed processing (high voltage) | 20 < n | 19 < n | 18 < n |
| medium-speed processing (medium voltage) | 16 < n ≦ 20 | 15 < n ≦ 19 | 14 < n ≦ 18 |
| low-speed processing (low voltage) | n ≦ 16 | n ≦ 15 | n ≦ 14 |

FIG. 3 (c)

| TMP<1:0> | PTIM<4:0> | | |
|---|---|---|---|
| | 00 (y1 °C ~ y2 °C) | 01 (y2 °C ~ y3 °C) | 11 (y3 °C ~ y4 °C) |
| high-speed processing (high voltage) | 1 (+x ps) | 3 (+3x ps) | 5 (+5x ps) |
| medium-speed processing (medium voltage) | 17 (-2x ps) | 0 (0 ps) | 2 (+2x ps) |
| low-speed processing (low voltage) | 20 (-5x ps) | 18 (-3x ps) | 16 (-x ps) |

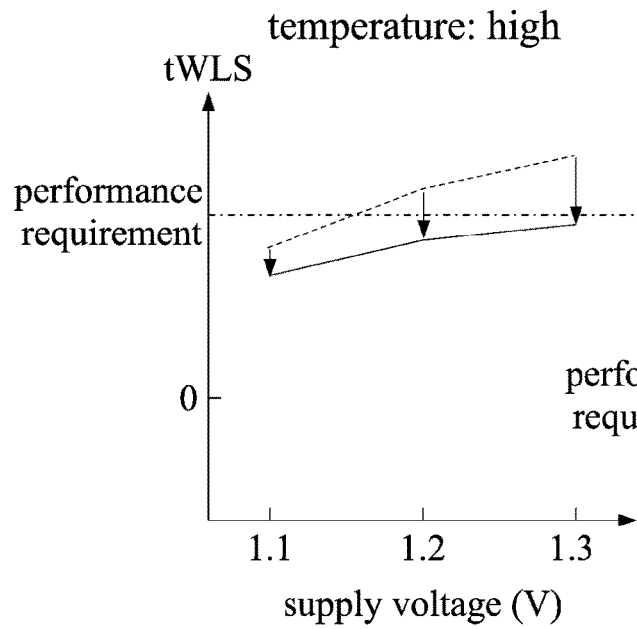
FIG. 5(a) temperature: high
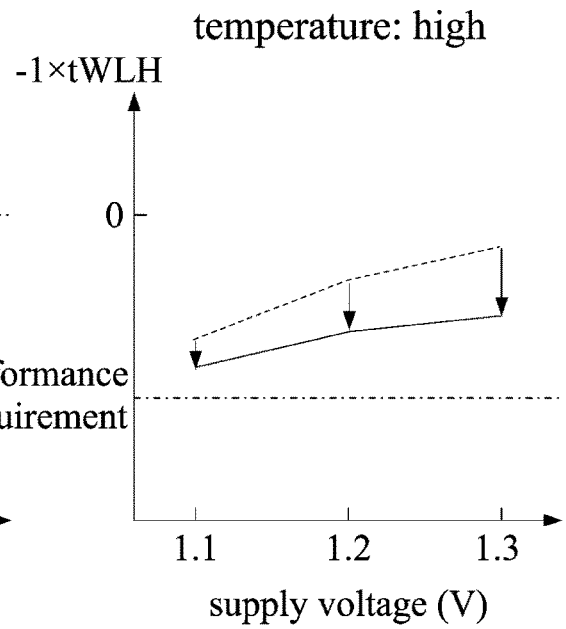
FIG. 5(b) temperature: high
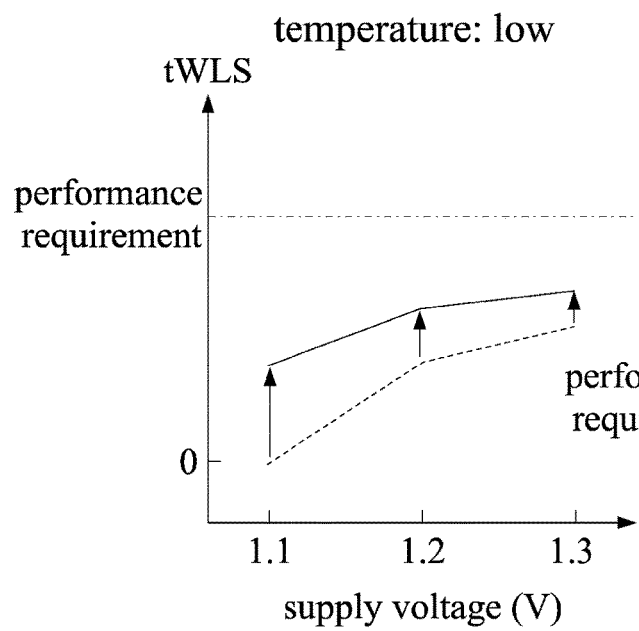
FIG. 5(c) temperature: low
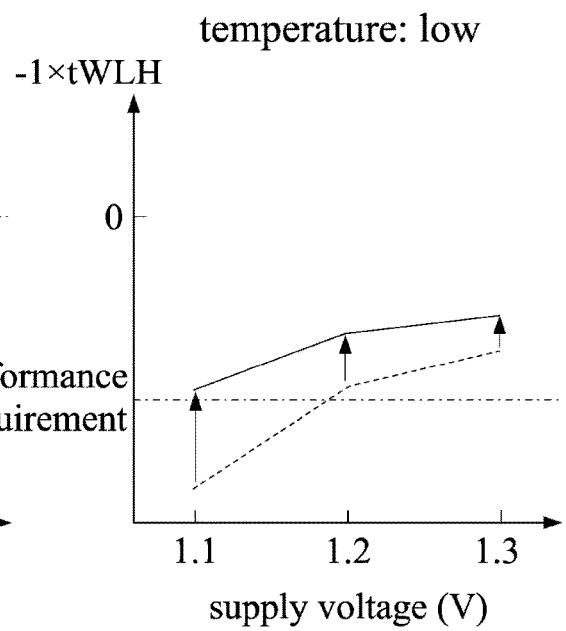
FIG. 5(d) temperature: low

SEMICONDUCTOR MEMORY DEVICE TO CONTROL OPERATING TIMING BASED ON TEMPERATURE OF THE MEMORY DEVICE

CROSS REFERENCE TO RELATED APPLICATIONS

This Application claims priority of Japan Patent Application No. 2020-210323, filed on Dec. 18, 2020, the entirety of which is incorporated by reference herein.

BACKGROUND OF THE INVENTION

Field of the Invention

The invention relates to a semiconductor memory device.

Description of the Related Art

In a semiconductor memory device, such as a dynamic random access memory (DRAM), as the transmission speed of signals increases, it is necessary to appropriately control the operation timing. For example, in the technique described in Patent Document 1, after power is applied, a signal is output from a ring oscillator with PVT (processing/power supply voltage/temperature) variation-related characteristics in a semiconductor memory device, and the operation timing (the start time and hold time) of the internal clock can be controlled according to the number of rising edges and falling edges in the above output signal.

PRIOR ARTS

Patent Documents

[Patent Document 1] U.S. Patent Application Publication No. 2018/0144781

BRIEF SUMMARY OF THE INVENTION

The Problems Solved By The Invention

A ring oscillator generally has the following characteristics: when the power supply voltage of the ring oscillator is higher or the temperature thereof is higher, the number of rising or falling edges of the output signal increases; when the power supply voltage of the ring oscillator is lower or the temperature thereof is lower, the number of rising or falling edges of the output signal decreases. Therefore, using only the number of rising or falling edges of the signal output from the ring oscillator, it is difficult to control the operation timing to comply with various performance requirements (for example, a low voltage at a low temperature, a high voltage at a low temperature, a low voltage at a high temperature, a high voltage at a high temperature, etc.) of the environment (for example, the temperature and power supply voltage, etc.) when the semiconductor memory device is operating.

Furthermore, in the technique described in Patent Document 1, since the operation timing of the internal clock is controlled only once after the power is applied, it may be difficult to appropriately control the operation timing according to variations in the environment while the semiconductor memory device is operating.

In view of the above-mentioned problems, the present invention aims to obtain a semiconductor memory device that can appropriately control operation timing according to the environment during the period when the semiconductor memory device is operating.

In order to solve the above problems, the present invention provides a semiconductor memory device comprising a temperature sensor, a voltage detection portion, and a control portion. The control portion controls operation timing in the semiconductor memory device to meet specific conditions based on the temperature detected by the temperature sensor after power is applied to the semiconductor memory device and the power supply voltage detected by the voltage detection portion after the power is applied.

According to the present invention, the operation timing in the semiconductor memory device is controlled to meet specific conditions based on the temperature detected by the temperature sensor after the power is applied and the power supply voltage detected by the voltage detection portion. Therefore, for various scenarios of temperature and power supply voltage aforementioned, the operation timing can be controlled to meet the specific conditions. It is more appropriate to control the operation timing according to the environment which is present when the semiconductor memory device is operating to control the operation timing based only on the number of rising or falling edges in a signal output from the ring oscillator. Therefore, it is possible to provide semiconductor memory devices with improved performance, such as increased transmission speed. Furthermore, according to the invention, since the operation timing can be controlled at any time after the power is applied, the operation timing can be appropriately controlled according to variations in the environment while the semiconductor memory device is operating. For example, the operation timing is controlled in a power-on sequence executed when the power is applied to the semiconductor memory device.

According to the present invention, during the period from the time when the power is applied to the time when the normal operation of the semiconductor memory device starts, the operation timing can be appropriately controlled based on the temperature of the semiconductor memory device and the power supply voltage. For example, the control portion controls the operation timing in the semiconductor memory device when a specific command is input to the semiconductor memory device.

According to the present invention, each time the specific command is input to the semiconductor memory device, the operation timing can be appropriately controlled based on the temperature and power supply voltage of the semiconductor memory device that are detected when the command is input. Therefore, the operation timing can be controlled according to variations in the environment while the semiconductor memory device is operating. For example, the control portion controls the operation timing in the semiconductor memory device before the specific command is executed.

According to the present invention, since the specific command can be executed based on the controlled operation timing, the command can be appropriately executed according to the environment which is present when the semiconductor memory device is operating. For example, when there is a memory that requires a refresh operation in the semiconductor memory device, the control portion controls the operation timing in the semiconductor memory device during execution of the refresh operation of the memory.

According to the present invention, each time the refresh operation of the memory is performed, the operation timing can be appropriately controlled according to the temperature and power supply voltage of the semiconductor memory device performing the refresh operation. Therefore, the operation timing can be appropriately controlled according to variations in the environment while the semiconductor memory device is operating. Furthermore, since the operation timing can be controlled during the execution of the refresh operation, it is possible to control the operation timing without interfering with the execution of the specific command. For example, the control portion controls the operation timing based on the temperature detected by the temperature sensor, the power supply voltage detected by the voltage detection portion, and the look-up table corresponding to a delay amount of the operation timing in the semiconductor memory device.

According to the present invention, the delay amount of the operation timing, which corresponds to the detected temperature and power supply voltage, is extracted from the look-up table, and the operation timing can be controlled simply and appropriately based on the extracted delay amount of the operation timing. For example, the voltage detection portion detects the power supply voltage according to the number of times a signal is switched.

According to the present invention, the more times the signal that is output from the ring oscillator is switched, the higher the detected power supply voltage will be; and when the signal is switched only a few times, the detected power supply voltage will be lower. Thus, the operation timing can be appropriately controlled using the number of times that the signal is switched.

In the embodiment, the high power supply voltage of the semiconductor memory device provides the same effect as the fast processing speed of the semiconductor memory device; the low power supply voltage of the semiconductor memory device provides the same effect as the slow processing speed of the semiconductor memory device. Therefore, in cases where a high power supply voltage is detected, this actually indicates a fast processing speed of the semiconductor memory device; when a low power supply voltage is detected, this actually indicates a slow processing speed of the semiconductor memory device. Furthermore, in the following description, it should be noted that the processing speed of the semiconductor memory device can be described together with the corresponding power supply voltage.

Effect Of The Invention

According to the semiconductor memory device of the present invention, the operation timing can be more appropriately controlled according to the environment which is present when the semiconductor memory device is operating.

A detailed description is given in the following embodiments with reference to the accompanying drawings.

BRIEF DESCRIPTION OF THE DRAWINGS

FIGS. 3(a)-3(c) show exemplary embodiments of the configuration of a look-up table;

FIGS. 5(a)-5(b) and 5(c)-5(d) are schematic diagrams showing of control states of the operation timing corresponding to various power supply voltages at a high temperature and a low temperature respectively;

DETAILED DESCRIPTION OF THE INVENTION

First Embodiment

Figure 1:
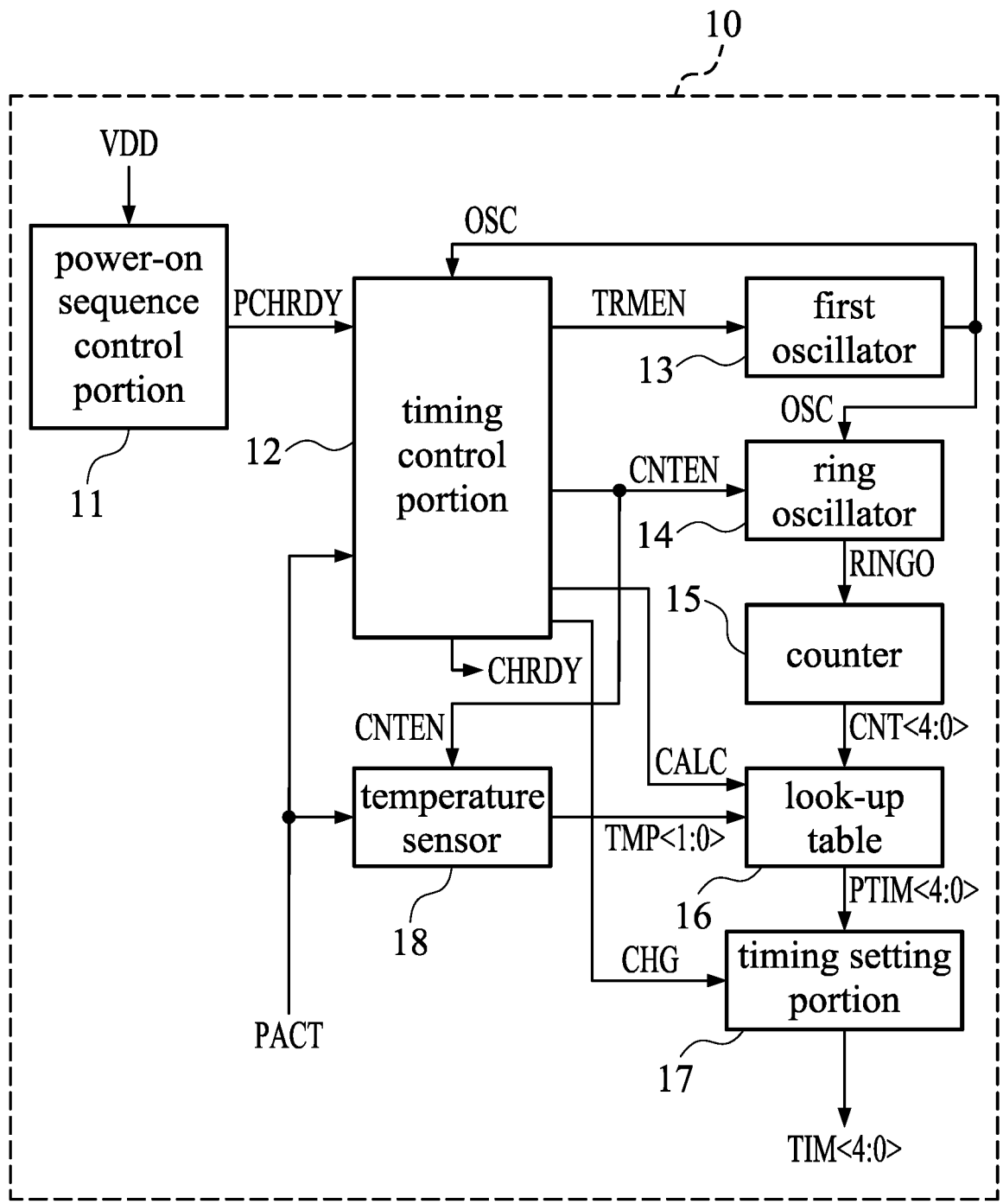
FIG. 1 is a block diagram of a configuration of a control portion of a semiconductor memory device according to a first embodiment of the present invention.

FIG. 1 is a block diagram of a configuration of a control portion of a semiconductor memory device according to a first embodiment of the present invention. The semiconductor memory device related to the embodiment of the present invention comprises a control portion 10, an interface portion (not shown in the figures) for sending and receiving signals between external devices and a memory array (not shown in the figures) comprising a plurality of memory cells arranged in a matrix. Each of the control portion 10, the interface portion, and the memory array is composed of specialized hardware devices and logic circuits.

Based on a write request received from an external device outside the interface portion, the control portion 10 controls a data writing operation to the memory array. Furthermore, based on a read request received from the external device outside the interface, the control portion 10 controls a data reading operation to the memory array. According to the temperature detected by the temperature sensor 18 and the power supply voltage detected by a voltage detection portion after the power is applied, the control portion 10 controls the operation timing in the semiconductor memory device to comply with specific conditions (for example, performance requirements).

In the power-on sequence which is performed when the power is applied to the semiconductor memory device, the control portion 10 can control the operation timing. Therefore, during the time period when the power is applied to the time when the normal operation of the semiconductor memory device starts, the operation timing can be appropriately controlled based on the temperature and power supply voltage of the semiconductor memory device.

When a specific command (for example, a valid command, such as a read command and a write command, etc.) is, the control portion 10 controls the operation timing in the semiconductor memory device. Therefore, each time the specific command is input, the operation timing can be appropriately controlled based on the temperature and power supply voltage of the semiconductor memory device which are detected when the command is input. Therefore, according to variations in the environment while the semiconductor memory device is operating, the operation timing can be controlled appropriately.

Before the specific command is executed, the control portion 10 can control the operation timing in the semiconductor memory device. Accordingly, since the specific command can be executed based on the operation timing which has been controlled, the specific command can be appropriately executed based on the environment which is present when the semiconductor memory device is operating.

By using the temperature detected by the temperature sensor 18, the power supply voltage detected by the voltage detection portion, and a look-up table 16 corresponding to the delay amount of the operation timing in the semiconductor memory device, the control portion 10 can control the operation timing. In detail, the delay amount of the operation timing corresponding to the detected temperature and power supply voltage is extracted from the look-up table 16, and the operation timing can be simply and appropriately controlled based on the extracted delay amount of the operation timing.

Based on how many times the signal is output from a specific ring oscillator 14 that operates according to the power supply voltage is switched, the voltage detection portion can detect the power supply voltage. In this way, for example, the more times the signal is output from the ring oscillator 14 is switched, the higher the detected power supply voltage will be; and when the signal is only switched a few times, the detected power supply voltage will be lower. Thus, the operation timing can be appropriately controlled based on the number of times the signal is switched.

The embodiment will be described using an example in which the control portion 10 controls the setup time (write leveling setup time, tWLS)) and the hold time (write leveling hold time, tWLH) of the clock signal when the data writing operation is requested.

Referring to FIG. 1, the configuration of the control portion 10 will be described. The control portion 10 comprises a power-on sequence control portion 11, a timing control portion 12, a first oscillator 13, a ring oscillator 14, a counter 15, a look-up table 16, a timing setting portion 17, and a temperature sensor 18.

When the power is applied to the semiconductor memory device and an external power supply voltage VDD is applied, the power-on sequence control portion 11 executes a specific power-on sequence, the power-on sequence comprises, for example, generating an initial internal power supply based on the external power supply voltage VDD, reading a trimming code for adjusting the internal power supply voltage, adjusting the internal power supply voltage based on the external power supply voltage VDD and the trim code, etc. Furthermore, when the execution of the power-on sequence ends, the power-on sequence control portion 11 outputs the pre-chip ready signal PCHRDY, which indicates the end of the power-on sequence, to the timing control portion 12.

When the pre-chip ready signal PCHRDY is input, the timing control portion 12 outputs a signal TRMEN, which is used for effective timing control processing, to the first oscillator 13. Furthermore, the timing control portion 12 outputs a signal CNTEN, which is used for the detection of the temperature and power supply voltage of the semiconductor memory device, to the ring oscillator 14 and the temperature sensor 18. Furthermore, the timing control portion 12 outputs a signal CALC, which is used to request the operation timing corresponding to the temperature and power supply voltage of the semiconductor memory device, to the look-up table 16.

Furthermore, the timing control portion 12 outputs a signal CHG, which is used for setting the required operation timing, to the timing setting portion 17. Furthermore, when the signal CHG is output to the timing setting portion 17, the timing control portion 12 outputs a chip ready signal CHRDY, which indicates that the semiconductor memory device is in an access state, to other devices or circuits in the control portion 10 (not shown in the figures).

Furthermore, when a signal PACT, which is from the command decoder (not shown in the figures) and indicates that the specific command has been input to the semiconductor memory device, is input, the timing control portion 12 outputs the signal CHG to the timing setting portion 17.

During the period when the signal TRMEN with a high level is input from the timing control portion 12, the first oscillator 13 generates an oscillation signal OSC at specific intervals and outputs oscillation signal OSC to the timing control portion 12 and the ring oscillator 14.

The ring oscillator 14 is configured to be operated based on the external power supply or the internal power supply voltage. During the period when the signal TRMEN with the high level is input from the timing control portion 12, the ring oscillator 14 outputs an oscillation signal RINGO whose frequency corresponds to the power supply voltage to the counter 15. In the embodiment, the ring oscillator 14 is configured to output the oscillation signal RINGO at a high frequency when the power supply voltage is higher. Furthermore, in order to control the timing operation correctly, the ring oscillator 14 may be composed of a device or a circuit which is similar to the device or circuit controlled by the operation timing and it may operate based on the same power supply.

When the oscillation signal RINGO is input from the ring oscillator 14, the counter 15 counts the number of times the oscillation signal RINGO is switched. Then, the counter 15 outputs the signal CNT<4:0> having a specific number of bits, which indicates the count value, to the look-up table 16. Furthermore, during the period when the signal CNTEN with a high level is newly input to the ring oscillator 14 from the timing control portion 12, the value of the signal CNT<4:0> can be maintained in the counter 15. Furthermore, in the embodiment, the ring oscillator 14 and the counter 15 are collectively an example of the "voltage detection portion" of the present invention.

During the period when the signal TRMEN with the high level is input from the timing control portion 12, according to the signal CNT<4:0> input from the counter 15 and the signal TMP<1:0> having the specific number of bits, for example, 2 bits in the embodiment, which represents the temperature range input from the temperature sensor 18, the look-up table 16 outputs the signal PTIM<4:0> having the specific number of bits, for example, 5 bits in the embodiment, which indicates the delay amount of the operation timing tWLS and the hold time tWLH, to the timing setting portion 17. Furthermore, the configuration example of the look-up table will be as follows.

When the signal TRMEN with the high level is input from the timing control portion 12, the timing setting portion 17 outputs the signal PTIM<4:0>, which is input from the look-up table 16 and used as the signal TIM<4:0> having the specific number of bits for setting the operation timing, to a device or a circuit which operates to control the operation timing of the device or circuit severing as the target controlled by the operation timing.

When the signal TRMEN with the high level is input from the timing control portion 12, the temperature sensor 18 detects the temperature of the semiconductor memory device and outputs the signal TMP<1:0> having the specific number of bits, which indicates the temperature range corresponding to the detected temperature, to the look-up table 16. When the signal PACT, which indicates that the specific command has been input to the semiconductor memory device, is input from the command decoder, the temperature sensor 18 detects the temperature of the semiconductor memory device and outputs the signal TMP<1:0> to the look up table 16. Furthermore, during the period when the signal CNTEN with the high level is newly input from the timing control portion 12, the value of the signal TMP<1:0> can be maintained in the temperature sensor 18.

Figure 2:
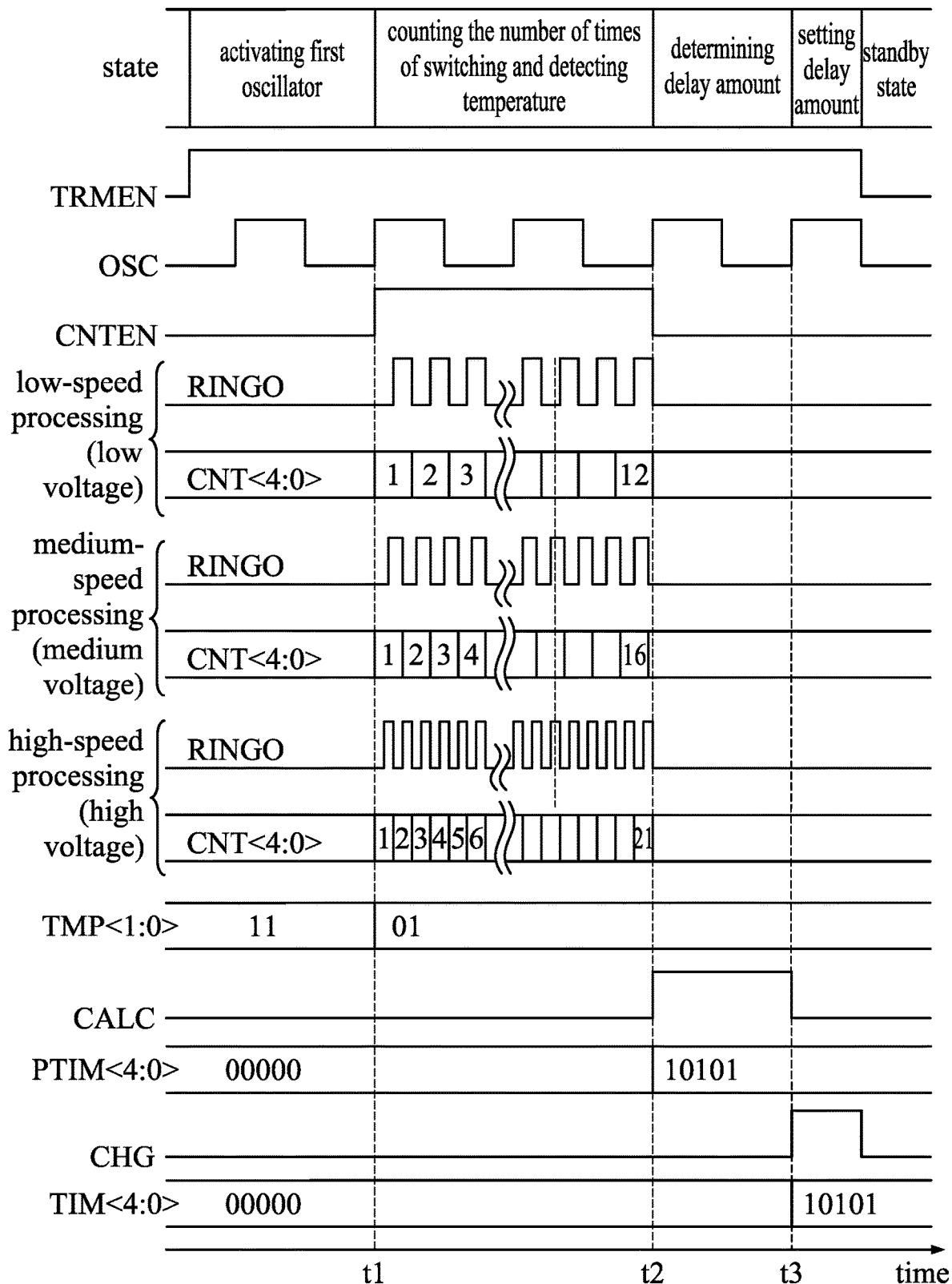
FIG. 2 is a timing diagram showing change in the voltage of signals of various portions in the control portion according to an exemplary embodiment.

In the following paragraphs, the operation of the semiconductor memory device of the embodiment will be described with reference to FIG. 2.

First, when the pre-chip ready signal PCHRDY indicating the end of the power-on sequence is input, the timing control portion 12 outputs the signal TRMEN with the high level to the first oscillator 13. During the period when the signal TRMEN having the high level is input, the first oscillator 13 generates the oscillation signal OSC at specific intervals and outputs oscillation signal OSC to the timing control portion 12 and the ring oscillator 14.

At the time point t1, the timing control portion 12 outputs the signal CNTEN with the high level to the ring oscillator 14 and the temperature sensor 18. During the period when the signal CNTEN with the high level, the ring oscillator 14 outputs the oscillation signal RINGO whose frequency corresponds to the power supply voltage to the counter 15. Furthermore, the counter 15 counts the number of times the oscillation signal RINGO is switched and outputs the signal CNT<4:0>, which indicates the count value, to the look-up table 16.

In this embodiment, according to the temperature range corresponding to the temperature of the semiconductor memory device detected by the temperature sensor 18, the number of times the oscillation signal RINGO is switched can be classified into one of the temperature ranges corresponding to the assigned number. In FIG. 2, when the value of the signal CNT<4:0> is 12, the power supply voltage of the semiconductor memory device is classified as a low voltage; when the value of the signal CNT<4:0> is 16, the power supply voltage of the semiconductor memory device is classified as a medium voltage; when the value of the signal CNT<4:0> is 21, the power supply voltage of the semiconductor memory device is classified as a high voltage.

Furthermore, when the signal CNTEN with the high level is input from the timing control portion 12, the temperature sensor 18 detects the temperature of the semiconductor memory device and outputs the signal TMP<1:0>, which indicates the temperature range corresponding to the detected temperature, to the look-up table 16.

Next, at the time point t2, the timing control portion 12 outputs the signal CALC with a high level to the look-up table 16. The look-up table 16 determines the delay amount based on the signal CNT<4:0> input from the counter 15 and the signal TMP<4:0> which is input from the temperature sensor 18 and represents the temperature range.

Referring to FIG. 3, an exemplary embodiment of the determination method for the delay amount will be explained. FIGS. 3(a)-3(c) is the configuration of the look-up table 16. As shown in FIG. 3(a), each value of the signal PTIM<4:0> (0~31 in FIG. 3(a)) in the look-up table 16 corresponds to a delay amount. In the example in FIG. 3(a), as the value of the signal PTIM<4:0> gradually increases from 0 to 15, the delay amount is increased in the positive direction; as the value of the follower signal PTIM<4:0> gradually increases from 16 to 31, the delay amount increases in the negative direction. Furthermore, in FIG. 3(a), x is any positive arbitrary number. Furthermore, the setup time of the clock signal tWLS is improved according to the delay in the positive direction, and the hold time tWLH of the clock signal is improved according to the delay in the negative direction.

As shown in FIG. 3(b), each of the temperature ranges of the assigned number and each of the voltage ranges of the assigned number in the look-up table 16 correspond to one value of the signal CNT<4:0>. Furthermore, in FIG. 3(b), y1, y2, y3, and y4 (y1<y2<y3<y4) are arbitrary numbers, when the value of the signal TMP<1:0> is 0b01 and the value of the signal CNT<4:0> is 16, for example, it is determined that the power supply voltage is a medium voltage. Furthermore, when the value of the signal TMP<1:0> is 0b11 and the value of the signal CNT<4:0> is 21, it is determined that the power supply voltage is a high voltage.

As shown in FIG. 3(c), each of the temperature ranges of the assigned number and each of the voltage ranges of the assigned number in the look-up table 16 corresponds to one value of the signal PTIM<4:0>. In FIG. 3(c), in cases where the temperature of the semiconductor memory device is low, the lower the power supply voltage is, the greater the absolute value of the delay amount. In cases where the temperature of the semiconductor memory device is high, the higher the power supply voltage is, the greater the absolute value of the delay amount is.

In the embodiment described above, when the value of the signal TMP<1:0> is 0b01 and the value of the signal CNT<4:0> is 16, it is determined that the value of the signal PTIM<4:0> is 0 (in FIG. 3(a), 0 ps). Furthermore, when the value of the signal TMP<1:0> is 0b11 and the value of the signal CNT<4:0> value is 21, it is determined that the value of the signal PTIM<4:0> is 5.

Therefore, according to the signal CNT<4:0> input from the counter 15 and the signal TMP<1:0> which is input from the temperature sensor 18 and represents the temperature range, the delay amount is determined.

Returning to FIG. 2, at the time point t3, the timing control portion 12 outputs the signal CHG with a high level to the timing setting portion 17. The timing setting portion 17 outputs the signal PTIM<4:0>, which is input from the look-up table 16 and used as the signal TIM<4:0> for setting the operation timing, to a device or a circuit which operates to control the operation timing of the device or circuit serving as the target controlled by the operation timing.

Furthermore, the timing control portion 12 outputs the chip ready signal CHRDY, which indicates that the semiconductor memory device is in the access state, to other devices or circuits in the control portion 10 (not shown in the figures).

Therefore, in the power-on sequence which is executed when the power is applied to the semiconductor memory device, the operation timing in the semiconductor memory device can be controlled.

Figure 4:
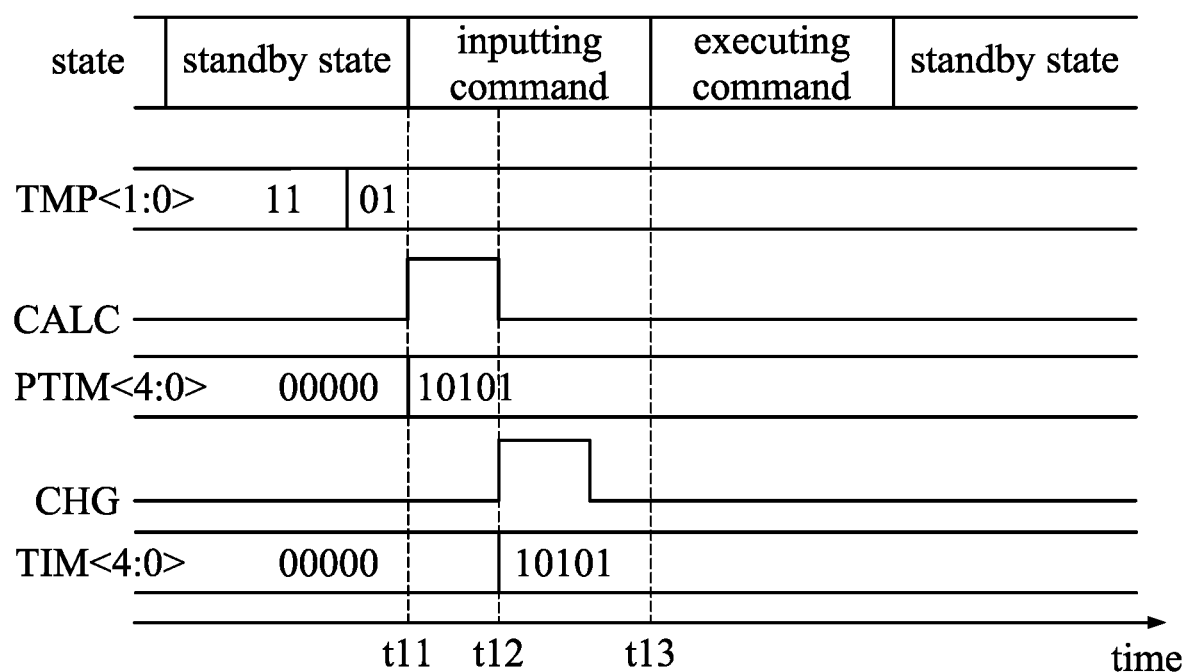
FIG. 4 is a schematic diagram showing changes in the signals in the control portion with time when a specific command is input.

Next, referring to FIG. 4, an exemplary embodiment of controlling the operation timing in the semiconductor memory device when a specific command is input will be described.

First, assume that the semiconductor memory device is in a standby state. In this state, the timing control portion 12 outputs the signal CNTEN with the high level to the temperature sensor 18 at arbitrary intervals.

At the time point t11, when the signal PACT, which indicates that the specific command has been input to the semiconductor memory device, is input from the command decoder (not shown in the figures), the timing control portion 12 outputs the signal CALC with the high level to the look-up table 16. According to the signal CNT<4:0> input from the counter 15 and the signal TMP<4:0> which is input from the temperature sensor 18 and represents the temperature range, the look-up table 16 outputs the signal PTIM<4:0>, which represents the determined delay amount, to the timing setting portion 17.

Next, at the time point t12, the timing control portion 12 outputs the signal CHG with the high level to the timing setting portion 17. The timing setting portion 17 outputs the signal TIM<4:0> to a device or a circuit, which operates to control the operation timing of the device or circuit serving as the target controlled by the operation timing.

Furthermore, at the time point t13, when the timing control portion 12 starts to execute the specific command, the timing control portion 12 can control other devices or circuits in the control portion 10.

Therefore, when the specific command is input, the operation timing in the semiconductor memory device can be controlled.

FIG. 5 shows an example of the control states of the operation timing of the semiconductor memory device related to the first embodiment. FIGS. 5(a)-(b) and FIGS. 5(c)-5(d) are schematic diagrams showing of the control states of the operation timing corresponding to various power supply voltages at a high temperature and a low temperature respectively.

As shown in FIG. 5(a), when the semiconductor memory device is at a high temperature, if the power supply voltage is higher, the setup time tWLS cannot meet the performance requirements, as described above, at a high temperature, the absolute value of the delay amount becomes larger as the power supply voltage becomes higher by controlling the operation timing. Even if the power supply voltage becomes higher, the setup time tWLS can also meet the performance requirements, as shown in FIG. 5(b), the hold time tWLH can also meet the performance requirements.

Furthermore, as shown in FIG. 5(d), when the semiconductor memory device is at a low temperature, if the power supply voltage is lower, the hold time tWLH cannot meet the performance requirements, as described above, at a low temperature, the absolute value of the delay amount becomes larger as the power supply voltage becomes lower by controlling the operation timing. Even if the power supply voltage becomes lower, the hold time tWLH can meet the performance requirements, as shown in FIG. 5(c), the setup time tWLS can also meet the performance requirements.

As described above, for the semiconductor memory device according to the embodiment, the operation timing in the semiconductor memory device is controlled to meet the performance requirements according to the temperature detected by the temperature sensor 18 after the power is applied and the power supply voltage detected by the ring oscillator 14 and the counter 15. Therefore, for various scenarios of the temperature and power supply voltage, the operation timing can be controlled to meet the specific conditions. Therefore, for example, compared to controlling the operation timing based only on the number of rising or falling edges in the signal output from the ring oscillator 14, the operation timing can be more appropriately controlled according to the environment which is present when the semiconductor memory device is operating. Therefore, it is possible to complete the semiconductor memory devices with improved performance, such as increased transmission speed. According to the semiconductor memory device of the embodiment, since the operation timing can be controlled at any time after the power is applied, the operation timing can be appropriately controlled according to variations in the environment while the semiconductor memory device is operating.

Furthermore, according to the semiconductor memory device of the embodiment, since the operation timing can be controlled after the power is applied, the process of presetting the operation timing can be omitted in the test process during the manufacture. In this way, the testing process can be simplified during the manufacture of the semiconductor memory device.

Second Embodiment

In the following paragraphs, a second embodiment of the present invention will be explained. The difference between the semiconductor memory device of the embodiment and the first embodiment is that the operation timing is controlled when a pre-defined command is input. Hereinafter, the configuration different from the first embodiment will be described.

Figure 6:
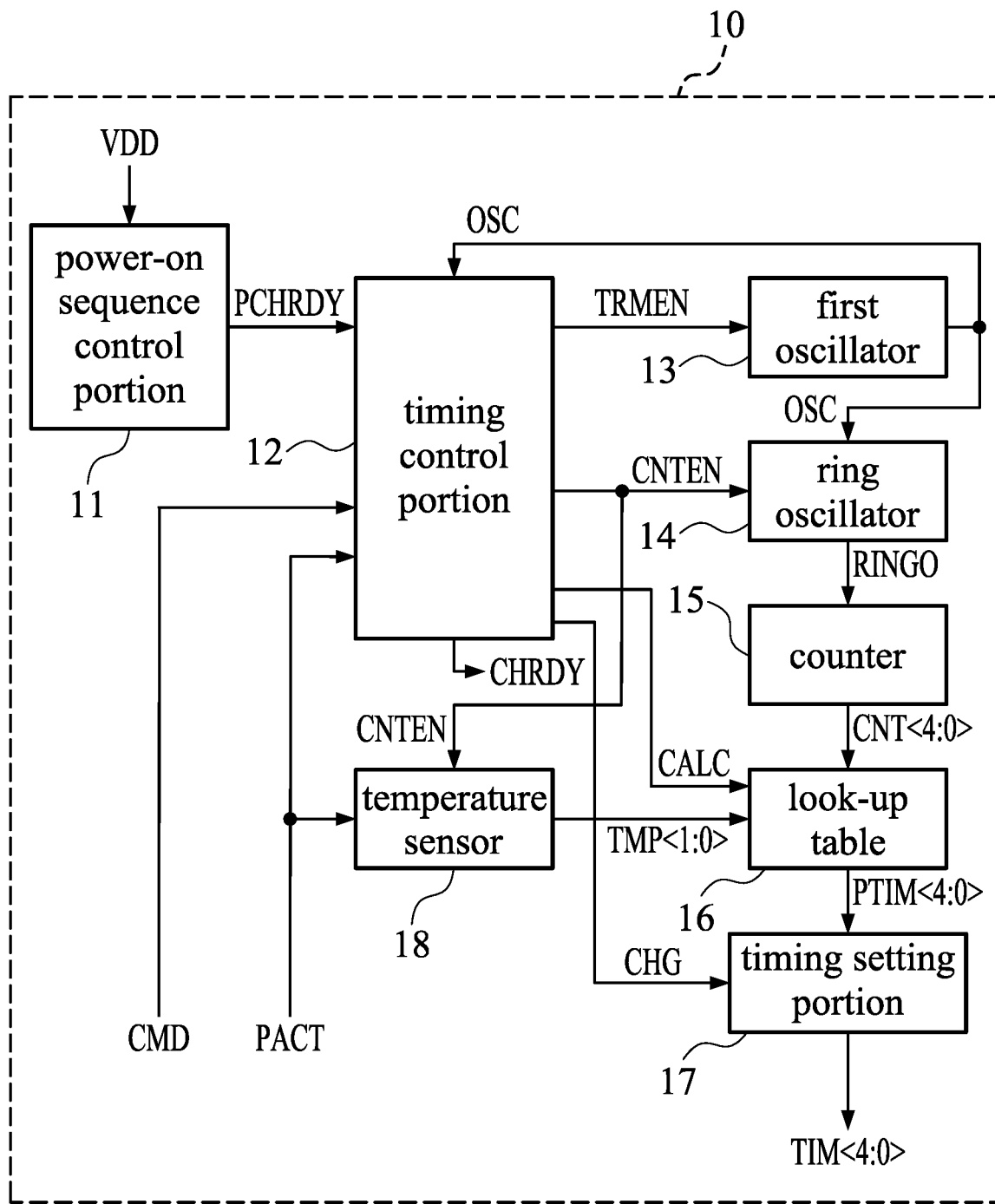
FIGS. 6 and 7 are block diagrams of a configuration of a control portion of a semiconductor memory device according to a second and a third embodiment of the present invention.

FIG. 6 shows the configuration of the semiconductor memory device according to the second embodiment. In FIG. 6, a signal CMD, which indicates that the pre-defined command is input to the semiconductor memory device, is input to the timing control portion 12 from the command decoder (not shown in the figures).

In the embodiment, the pre-defined command may be, for example, a command which is used for executing the control of the operation timing or a combination of the command which is used for executing the control of the operation timing and a designated command. Furthermore, the designated command included in the pre-defined command can be, for example, a read command, a write command, or a command that requires relatively high timing accuracy.

In the embodiment, when the signal CMD is input from the command decoder, the timing control portion 12 outputs the signal TRMEN, which is used for effective timing control processing, to the first oscillator 13. The timing control portion 12 outputs the signal CNTEN, which is used for the detection of the temperature and power supply voltage of the semiconductor memory device, to the ring oscillator 14 and the temperature sensor 18. Furthermore, the timing control portion 12 outputs the signal CALC, which is used to request the operation timing corresponding to the temperature and power supply voltage of the semiconductor memory device, to the look-up table 16.

Furthermore, the timing control portion 12 outputs the signal CHG, which is used for setting the required operation timing, to the timing setting portion 17. Furthermore, when the signal CHG is output to the timing setting portion 17, the timing control portion 12 executes another command (for example, a read command, a write command, a command for read leveling, and a command for write leveling, etc.) included in pre-defined commands to control other devices or circuits in the control portion 10.

Therefore, according to the semiconductor memory device of the embodiment, the same effect as the above-mentioned first embodiment can be achieved.

Third Embodiment

In the following paragraphs, a third embodiment of the present invention will be explained. The difference between the semiconductor memory device of the embodiment and the above-mentioned embodiments is that when there is a memory that requires a refresh operation, the operation timing in the semiconductor memory device is controlled during the refresh operation of the memory. Hereinafter, the configuration different from the above-mentioned embodiments will be described.

Figure 7:
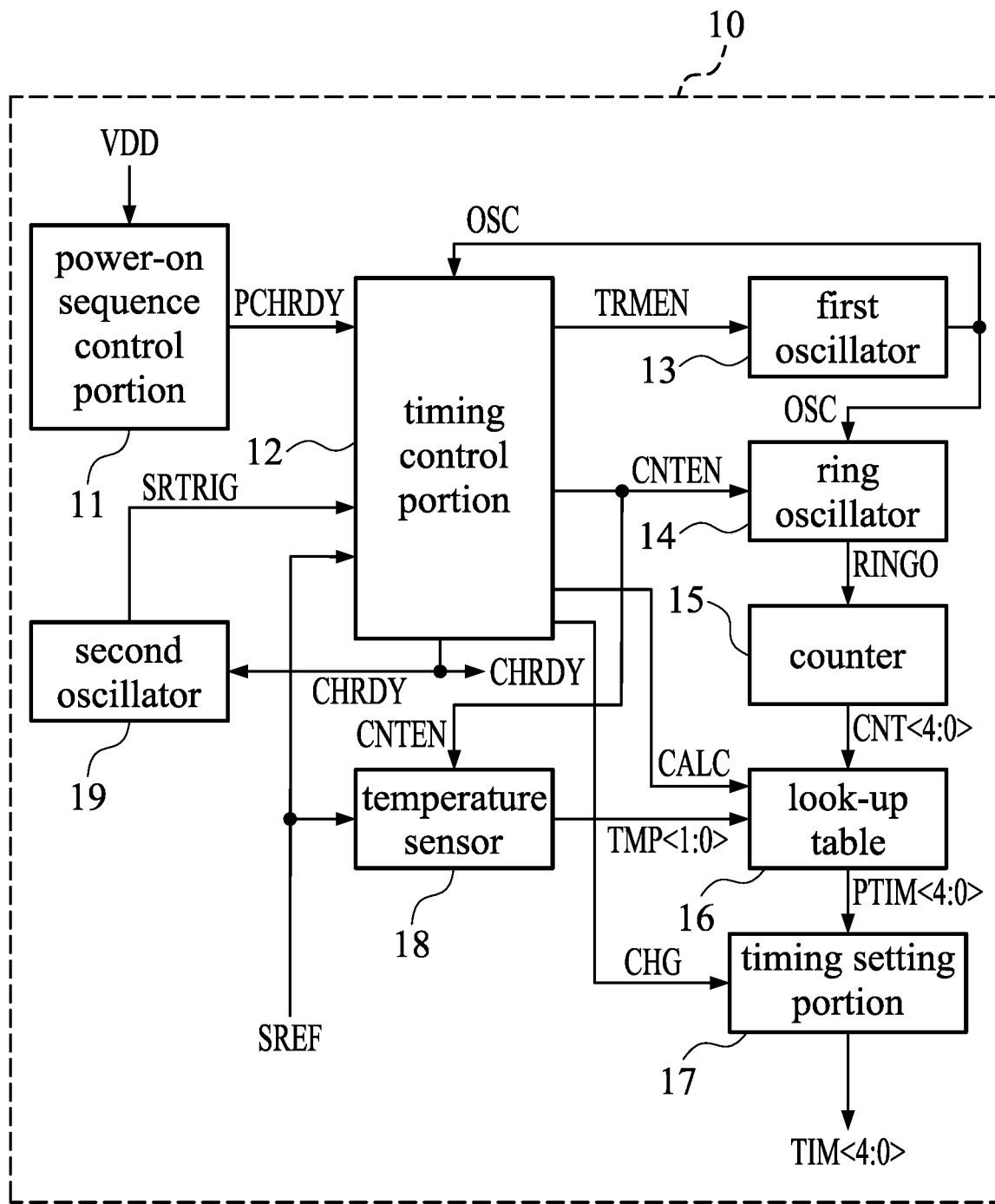

FIG. 7 shows the configuration of the control portion 10 of the semiconductor memory device according to the third embodiment, in addition to the above-mentioned portions 11~18, the control portion 10 further comprises a second oscillator 19. Furthermore, the timing control portion 12 and the temperature sensor 18 are configured to receive a signal SREF, which indicates a request to perform a refresh operation, from the command decoder (not shown in the figures).

When the chip ready signal CHRDY is input from the timing control portion 12, the second oscillator 19 generates a signal SRTRIG, which is used to trigger the refresh operation, at specific intervals and outputs the signal SRTRIG to the timing control portion 12.

When there is no characteristic related to the temperature and power supply voltage of the semiconductor memory device, the first oscillator 13 and second oscillator 19 collectively set or determine one of the first oscillator 13 and second oscillator 19 to perform respective functions of the first oscillator 13 and the second oscillator 19.

Figure 8:
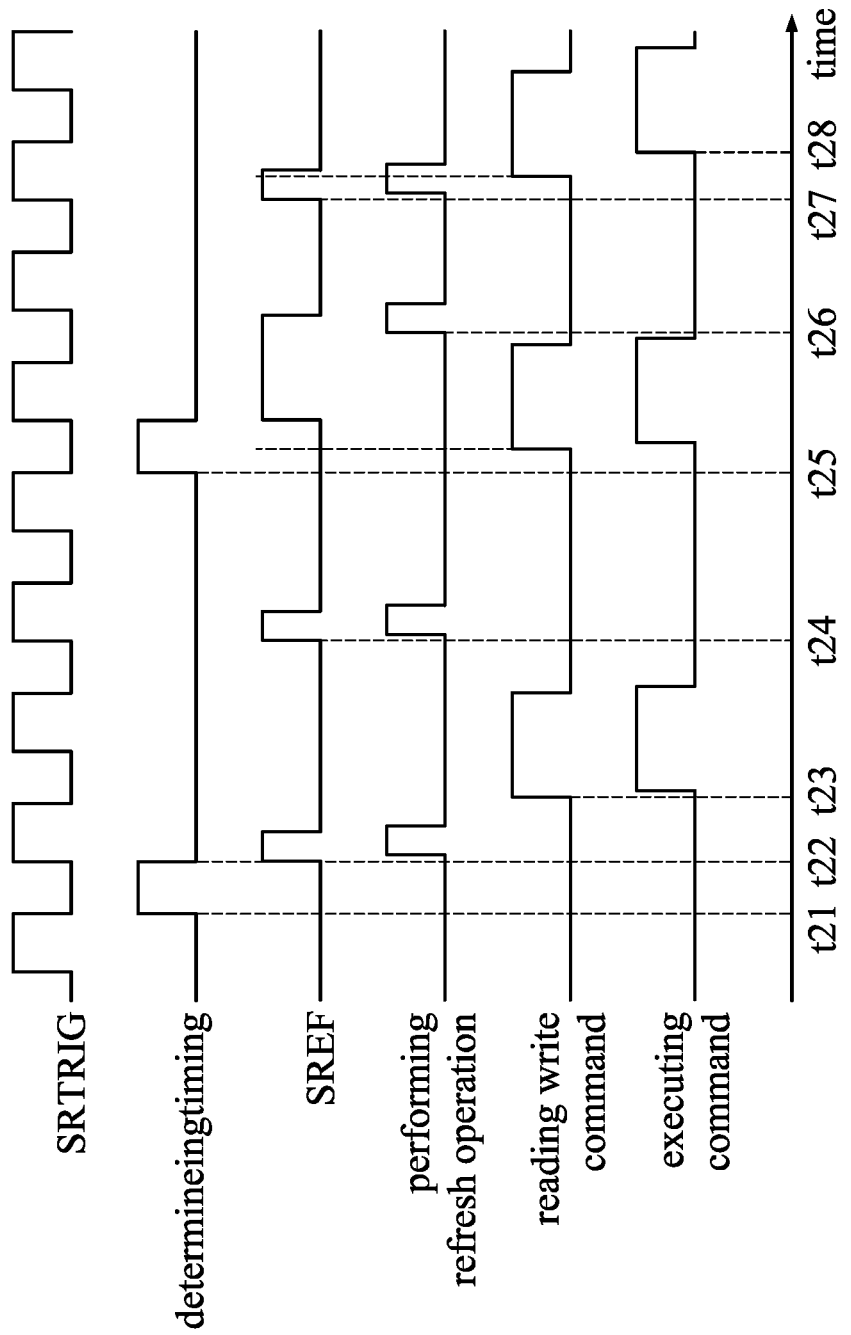
FIG. 8 is a timing diagram showing change in voltages of signals of various portions in the control portion according to another exemplary embodiment.

Next, the operation of the semiconductor memory device of the embodiment will be described with reference to FIG. 8. FIG. 8 is a timing diagram showing change in the voltages of the signals of the various portions in the control portion 10, whenever the signal SRTRIG is switched four times, it is determined that the operation timing is at the falling edge of the fourth signal SRTRIG, and whenever the signal SRTRIG is switched twice, the signal SREF with a high level is input to the timing control portion 12 at the rising edge of the second signal SRTRIG.

First, at the time point t21, when the determination of the operation timing starts, the timing control portion 12 outputs the signal TRMEN, which is used for effective timing control processing, to the first oscillator 13. Furthermore, the timing control portion 12 outputs the signal CNTEN, which is used for the detection of the temperature and power supply voltage of the semiconductor memory device, to the ring oscillator 14 and the temperature sensor 18. Furthermore, the timing control portion 12 outputs the signal CALC, which is used to request the operation timing corresponding to the temperature and power supply voltage of the semiconductor memory device, to the look-up table 16.

Next, at the time point t22, when the signal SREF with the high level is input to the timing control portion 12, the timing control portion 12 sets the operation timing when the refresh operation starts.

Figure 9:
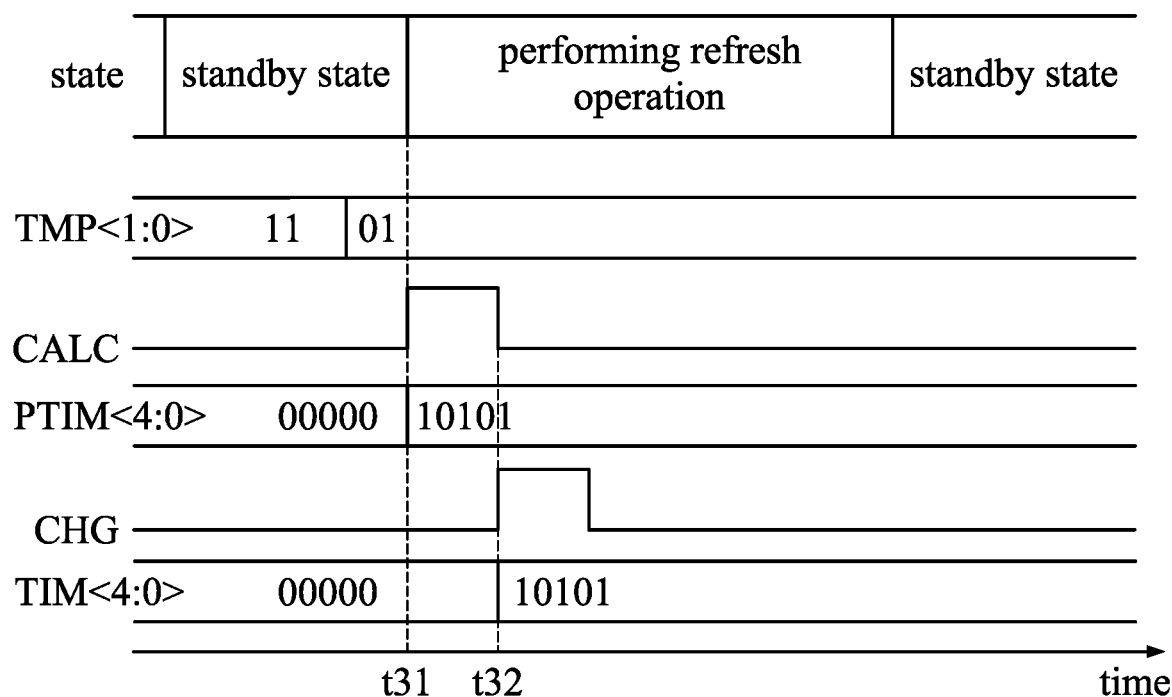
FIG. 9 is a timing diagram showing changes in the voltages of the signals of the various portions in the control portion when a refresh operation is performed.

FIG. 9 is a schematic diagram showing change in the voltages of the signals of various portions in the control portion 10 when the refresh operation is performed. At the time point t31, when the signal SREF with the high level is input from the command decoder (not shown in the figures), the timing control portion 12 outputs the signal CALC with the high level to the look-up table 16. The look up table 16 determines the delay amount based on the signal CNT<4:0> input from the counter 15 and the signal TMP<4:0> which is input from the temperature sensor 18 and represents the temperature range and outputs the signal PTIM<4:0> representing the determined delay amount to the timing setting portion 17.

Next, at the time point t32, the timing control portion 12 outputs the signal CHG the high level to the timing setting portion 17. Then, the timing setting portion 17 outputs the signal TIM<4:0> to a device or a circuit, which controls the operation timing of the device or circuit serving as the target controlled by the operation timing. Furthermore, the timing control portion 12 performs the refresh operation to control other devices or circuits in the control portion 10.

Returning to FIG. 8, at the time point t23, when a signal representing the input of a read or write command is input from the command decoder (not shown in the figures), the timing control portion 12 executes the read or write command to control other devices or circuits in the control portion 10. In the above case, during the period from the time point t22 to the time point t23, the read or write command is executed according to the controlled operation timing.

Next, at the time point t24, when the reference signal SREF with the high level is input to the timing control portion 12, the timing control portion 12 sets the operation timing when the semiconductor memory device starts to perform the refresh operation.

Then, at the time point t25, when the semiconductor memory device starts to determine the operation timing, the timing control portion 12 outputs the signal TRMEN, which is used for effective timing control processing, to the first oscillator 13. Furthermore, the timing control portion 12 outputs the signal CNTEN, which is used for the detection of the temperature and power supply voltage of the semiconductor memory device, to the ring oscillator 14 and the temperature sensor 18. Furthermore, the timing control portion 12 outputs a signal CALC, which is used to request the operation timing corresponding to the temperature and power supply voltage of the semiconductor memory device, to the look-up table 16.

In the embodiment, before the signal SREF with the high level is input to the timing control portion 12, when a signal, which indicates that the read or write command has been input, is input from the command decoder (not shown in the figures), the timing control portion 12 keeps the signal SREF at the high level and executes the read or write command to control other devices or circuits in the control portion 10. Then, at the time point t26 after the execution of the read or write command ends, the timing control portion 12 starts to perform the refresh operation including the setting of the operation timing, as shown in FIG. 9.

Next, at the time point t27, when the signal SREF with the high level is input to the timing control portion 12, the timing control portion 12 starts to perform the refresh operation, during the execution of the refresh operation, when a signal, which indicates that the read or write command has been input, is input from the command decoder (not shown in the figures), at the time point t28 after the execution of the refresh operation ends, the timing control portion 12 executes the read or write command to control other devices or circuits in the control portion 10.

As described above, according to the semiconductor memory device of the embodiment, each time the refresh operation of the memory is performed, the operation timing can be appropriately controlled according to the temperature and power supply voltage of the semiconductor memory device performing the refresh operation. Therefore, the operation timing can be appropriately controlled according to variations in the environment while the semiconductor memory device is operating. Furthermore, according to the semiconductor memory device of the embodiment, since the operation timing can be controlled during the execution of the refresh operation (that is, during the period when a specific command (for example, a valid command (such as a read command and a write command, etc.) is not executed), it is possible to control the operation timing without interfering with the execution of the specific command.

The various embodiments described above are used to simply describe and explain the present invention, and, however, are not described to limit the present invention. Therefore, each feature shown in each of the above-mentioned embodiments is intended to include all design changes and equivalents belonging to the technical scope of the present invention.

For example, in each of the above-mentioned embodiments, a case in which the setup time tWLS and the hold time tWLH of the clock signal are controlled when data writing is requested is described as an example, but the present invention is not limited thereto. For example, when data reading is requested, the setup time and the hold time of the clock signal may be controlled, and another operation timing may be controlled.

Furthermore, in each of the above-mentioned embodiments, the temperature of the semiconductor memory device is classified into any one of the three temperature ranges, and the power supply voltage of the semiconductor memory device is classified into any one of the three voltage ranges. However, the present invention is not limited thereto. For example, the temperature of the semiconductor memory device may be classified into any one of a plurality of temperature ranges other than three temperature ranges, and the power supply voltage of the semiconductor memory device may be classified into any one of a plurality of power supply ranges other than three power supply ranges.

Furthermore, in each of the above-mentioned embodiments, the configuration of the control portion 10 is an example. However, the configuration of the control portion 10 can be appropriately changed, or the control portion 10 can adopt other configurations.

While the invention has been described by way of examples and preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device comprising:
a temperature sensor configured to detect a temperature of the semiconductor memory device;
a voltage detection portion configured to detect a power supply voltage of the semiconductor memory device; and
a control portion configured to control operation timing in the semiconductor memory device to meet specific conditions according to the temperature which is detected by the temperature sensor after power is applied to the semiconductor memory device and the power supply voltage which is detected by the voltage detection portion after the power is applied,
wherein the voltage detection portion detects the power supply voltage according to the number of times a signal output from a specific ring oscillator which operates according to the power supply voltage is switched.

2. The semiconductor memory device as claimed in claim 1, wherein the control portion controls the operation timing in a power-on sequence which is executed when the power is applied to the semiconductor memory device.

3. The semiconductor memory device as claimed in claim 1, wherein the control portion controls the operation timing when a specific command is input to the semiconductor memory device.

4. The semiconductor memory device as claimed in claim 1, wherein the control portion controls the operation timing before a specific command is executed.

5. The semiconductor memory device as claimed in claim 1, wherein when there is a memory that requires a refresh operation in the semiconductor memory device, the control portion controls the operation timing during execution of the refresh operation of the memory.

6. The semiconductor memory device as claimed in claim 1, wherein the control portion controls the operation timing based on the temperature detected by the temperature sensor, the power supply voltage detected by the voltage detection portion, and a look-up table corresponding to a delay amount of the operation timing in the semiconductor memory device.

* * * * *